(12) United States Patent
Hong

(10) Patent No.: US 7,116,605 B2
(45) Date of Patent: Oct. 3, 2006

(54) DUAL PORT SRAM CELL

(75) Inventor: Byung-Il Hong, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 73 days.

(21) Appl. No.: 10/877,554

(22) Filed: Jun. 24, 2004

(65) Prior Publication Data
US 2005/0226084 A1 Oct. 13, 2005

(30) Foreign Application Priority Data
Mar. 31, 2004 (KR) .................. 10-2004-0022194

(51) Int. Cl.
*G11C 8/00* (2006.01)

(52) U.S. Cl. .................. 365/230.05; 365/154; 365/156; 365/205

(58) Field of Classification Search ........... 365/230.05, 365/205, 154, 189.01
See application file for complete search history.

(56) References Cited

U.S. PATENT DOCUMENTS

| | | | |
|---|---|---|---|
| 4,833,648 A | 5/1989 | Scharrer et al. | |
| 4,995,001 A * | 2/1991 | Dawson et al. | 365/154 |
| 5,214,327 A | 5/1993 | Saeki et al. | |
| 5,325,338 A * | 6/1994 | Runaldue et al. | 365/230.05 |
| 5,561,638 A | 10/1996 | Gibson et al. | |
| 5,790,461 A | 8/1998 | Holst | |
| 6,222,777 B1 * | 4/2001 | Khieu | 365/189.02 |
| 6,598,198 B1 * | 7/2003 | Furuta et al. | 714/763 |

* cited by examiner

*Primary Examiner*—Huan Hoang
(74) *Attorney, Agent, or Firm*—Blakely Sokoloff Taylor & Zafman

(57) ABSTRACT

The present invention provides a SRAM that is capable of performing a writing and reading operations simultaneously without collision while reducing size of cell, by providing a dual port SRAM cell. For this, the dual port SRAM cell, including: a writing section having a first transistor for inputting a data input signal from a bit line in response to a control signal from a word line; a data storage section having three transistors for storing the data input signal from the outside through the writing section; and a reading section having two transistors for reading the data input signal stored in the data storage section in response to control signal from a common line.

19 Claims, 4 Drawing Sheets

DUAL PORT SRAM CELL

FIELD OF THE INVENTION

The present invention relates to a unit cell circuit of SRAM (static random access memory) in a semiconductor memory device; and, more particularly, to a dual port SRAM cell with 6 transistors.

DESCRIPTION OF RELATED ART

In general, SRAM has an advantage that there is not required additional refresh because it employs latch type of cell unlike DRAM (dynamic random access memory). Conventionally, a single port SRAM that is composed of 6 transistors (TRs) is used as cell circuit.

Meanwhile, a RAM embedded TFT LCD driver generally carries out the following two operations: one is a writing operation to write data to be displayed in the RAM and the other is a reading operation to read the data written in the RAM. The data written in the RAM is read and outputted through a output driver periodically for its scanning on LCD panel.

In such RAM embedded TFT LCD driver, in case that the single port SDRAM cell with 6 TRs is employed, reading data stored for scanning tends to collide with the writing operation. To solve the problem, a dual port SRAM cell is traditionally used.

FIG. 1 is a circuit diagram of the single port SRAM cell with 6 TRs, and FIG. 2 is a circuit diagram of the dual port SRAM cell with 8 TRs.

Referring to FIG. 1, a memory cell 100 comprises two access transistors NO2A and NO2B for connecting storage nodes cellA and cellB to bit lines BL and BLX according to a switching that depends on a signal via a word line WL, and four transistors P00, P01, N00, N01 for configuring inverting latch between the storage nodes cellA and cellB. One pair of bit lines BL and BLX are input and output paths of data, whereas the word line WL is a path carrying a signal to control its input and output.

There exists complementary relationship between signal levels on a positive bit line BL and a negative bit line BLX. That is, if one of them is logic H state, then the other generally becomes logic L state. However, in order to increase operation speed of SRAM, it makes in such a manner that levels of the two signals are all set to logic H or L state, or to specific values such as VDD/2 before data is written in the SRAM or read therefrom.

Before or after data is written in the SRAM memory cell or read therefrom, in case that it is designed that both the positive bit line BL and the negative bit line BLX have VDD/2, operation procedure of the SRAM cell is as follow.

When writing data value of logic H in the SRAM memory cell, after the positive bit line BL and the negative bit line BLX are set to have VDD/2, it makes value to be written in the SRAM placed on the bit line by applying logic H onto the positive bit line BL and logic L onto the negative bit line BLX. After that, if a word line WL is enabled to have logic H, then values on the positive bit line BL and the negative bit line BLX are applied to the cell storage nodes cellA and cellB, respectively.

Since the transistors P00, N00 and P01, N01 are composed of pairs of inverters, they function to invert and output values at input nodes.

Thus, if data is inputted from the positive bit line BL and then H level signal is applied to the cell storage node cellA through the access transistor NO2A, the input signal is inverted by way of the inverters P00 and N00 and becomes L level state at the cell storage node cellB.

Similarly, if data is inputted from the negative bit line BLX and then L level signal is applied to the cell storage node cellB through the access transistor NO2B, the input signal is inverted by passing through the inverters P01 and N01 and becomes H level state at the cell storage node cellA.

Accordingly, H and L states are stably maintained at the nodes cellA and cellB, respectively.

In such a state, if it makes state of the word line WL changed to L, then signal levels at the nodes cellA and cellB are stably maintained as data values stored although new signal level is not applied from the positive bit line BL and the negative bit line BLX.

When reading data stored in the SRAM, the word line WL is first activated and set to have H state. This is contrary to the writing operation.

In the state that the positive bit line BL and the negative bit line BLX are designed to have VDD/2, if H level is applied onto the word line WL, H level and L level signals stored in the nodes cellA and cellB are outputted and provided to the positive bit line BL and the negative bit line BLX through the access transistors N02A and NO2B, respectively. At that time, signal levels on the bit lines BL and BLX are read as H and L, respectively.

A 8 TR dual port SRAM cell 110 shown in FIG. 2 comprises four NMOS transistors N12A, N10, N11, N12B, and four PNMOS transistors P10, P11, P12, P13.

A basic configuration further comprises two PMOS transistors P12 and P13, in addition to 6 TR single port SRAM shown in FIG. 1. The added two transistors are provided to resolve the problem that the single port SRAM can't perform writing and reading operations simultaneously.

In other words, 8 TR dual port SRAM cell 110 allows data to be displayed to be stored in the cell storage node through a pair of bit lines BL and BLX during the writing operation, and also allows the stored data to be outputted through the data line D during the reading operation. Thus, in the 8 TR dual port SRAM cell 110 as shown in FIG. 1, because a path for writing operation is separated from a path for reading operation, the writing and reading operations can be carried out independently, without collision.

More specifically, operation of the dual port SRAM cell with 8 TRs depends on the basic principle of operation of the single port SRAM shown in FIG. 1.

But, the dual port SRAM cell with 8 TRs further includes PMOS transistors P12 and P13 and outputs date in a cell storage node onto a data line D by a control signal on a common line C. In default state, the data line D provides logic L by a pull-down transistor N14 that consists of NMOS transistor.

In writing operation for the SRAM memory cell 110, it first allows H and L level data to be carried on the positive bit line BL and the negative bit line BLX, respectively, and then allows data level on a word line WL to be transited to H state, making the NMOS transistors N12A and N12B turned-on. At that time, there are stored H and L signals in the nodes cel1A and cellB, respectively.

By applying L level signal onto the common line C, data stored in the SRAM memory cell 110 can be outputted through the data line D.

But, before the signal is applied onto the common line C, there are carried out the following operations: the full-down transistor N14 is first turned-on, making the data line D be L level; and, then, the pull-down transistor N14 is turned-off.

If L level signal is inputted to the common line C, then the transistor P13 for the common line's selection becomes turned-on, thereby outputting signal in a node cellC to the data line D.

Data in the node cellC is decided by a signal in the node cellB and, if signal stored in the node cellB is L, the pull-up transistor P12 becomes ON, allowing value in the node cellC to be H. In this case, by turning-on the transistor P13 for the common line's selection, H signal is outputted onto the data line D.

If it makes data "0" written on the SRAM memory cell by inputting L and H signals onto the positive bit line BL and the negative line BLX, respectively, L and H signals are stored in the nodes cellA and cellB, respectively.

Thus, to read value in the node cellB through the common line C and the transistors P12 and P13, the transistor P12 is OFF and the transistor P13 is ON; and thus L level made by the pull-down transistor N14 is maintained on the data line D that is output node, enabling output of L signal.

On the other hand, the SRAM having the configuration as shown in FIG. 2 has an advantage that it is possible to read and write simultaneously, compared to the single port SRAM shown in FIG. 1, but has a disadvantage that size per cell is relatively large because it is composed of 8 transistors. As a result, since there are arrays of a number of cells in the SRAM, making RAM embedded TFT LCD driver chip incorporating therein SRAM increased in size.

SUMMARY OF THE INVENTION

It is, therefore, an object of the present invention to provide a SRAM that is capable of performing a writing and reading operations simultaneously without collision while reducing size of cell, by providing a dual port SRAM with 6 transistors.

In accordance with the present invention, there is provided a dual port SRAM cell with 6 transistors, including: a writing section having a transistor for inputting a data input signal from a bit line in response to a control signal from a word line; a data storage section composed of three transistors for storing the data input signal from the outside through the writing section; and a reading section composed of two transistors for reading the data input signal stored in the data storage section in response to control signal from a common line.

Preferably, the writing section is composed of one transistor whose gate is coupled to a word line, one port is connected to a single bit line and another port is coupled to a transistor that is coupled to the data storage section. And, the data storage section comprises: a second transistor whose gate is coupled to a first node on said another port of the first transistor, and drain and source are connected to a first supply voltage and a second node, respectively; a third transistor whose gate is connected to the second node, and drain and source are coupled to the first node and a second supply voltage, respectively; and a fourth transistor whose gate is connected to the first node, and drain and source are coupled to the first node and the second supply voltage, respectively. Further, the reading section comprises: a fifth transistor whose gate is coupled to the second node, and drain and source are connected to the third node and the second supply voltage, respectively; and a sixth transistor whose gate is connected to a common line C, and drain and source are coupled to a data line D carrying data to be read, and the third node, respectively.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, configuration and operation of a dual port SPAM cell circuit with 6 transistors of the invention will be described in detail with reference to the accompanying drawings.

Figure 3:
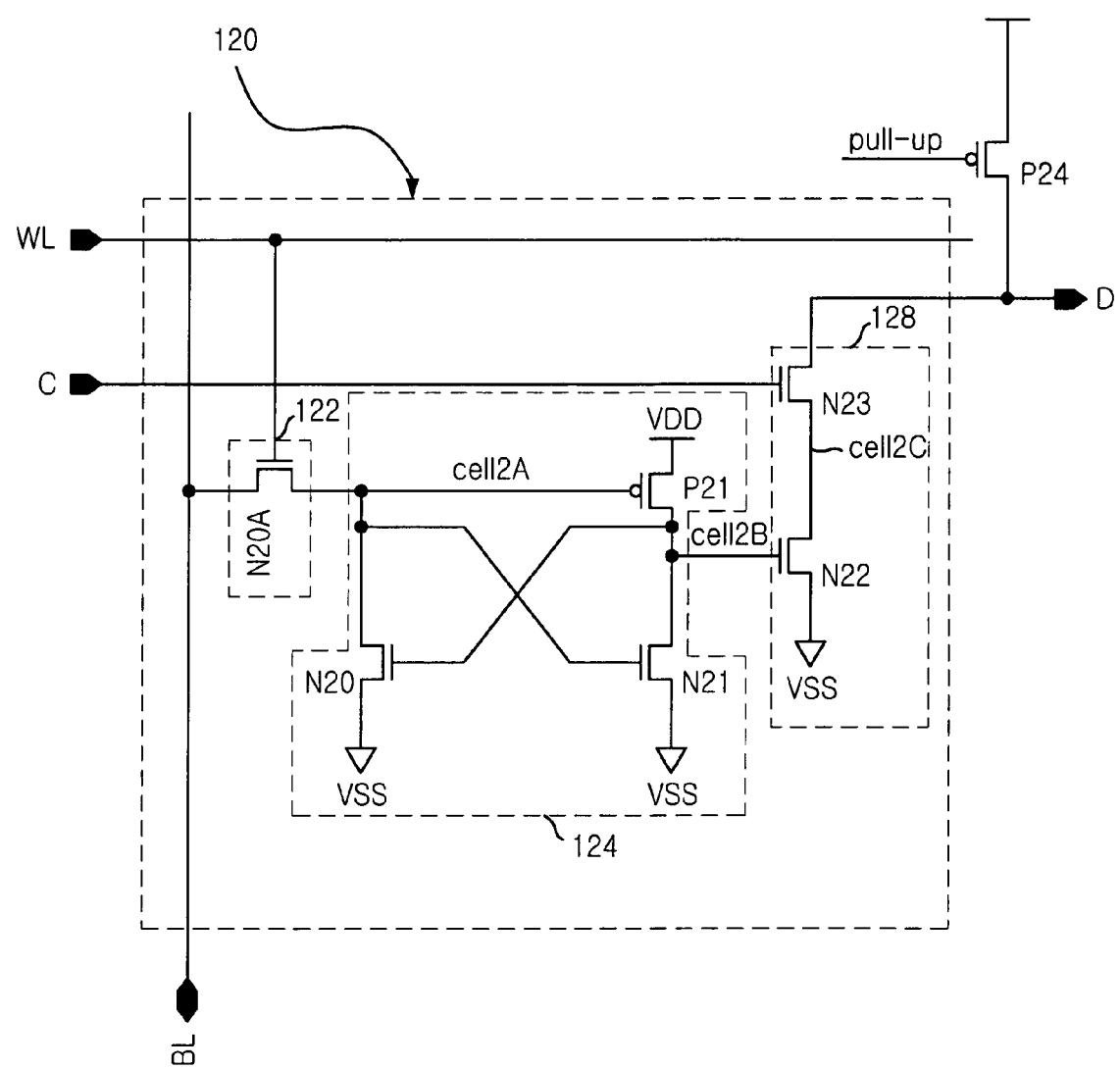
FIG. 3 is a circuit diagram of a dual port SRAM memory with 6 transistors in accordance with the present invention.

FIG. 3 is a circuit diagram of a dual port SRAM cell with 6 transistors in accordance with the present invention.

As shown in FIG. 3, the dual port SRAM cell 120 having 6 transistors in accordance with the present invention comprises NMOS transistors N20A, N20, N21, N22, N23, and one PMOS transistor P21.

Figure 1:
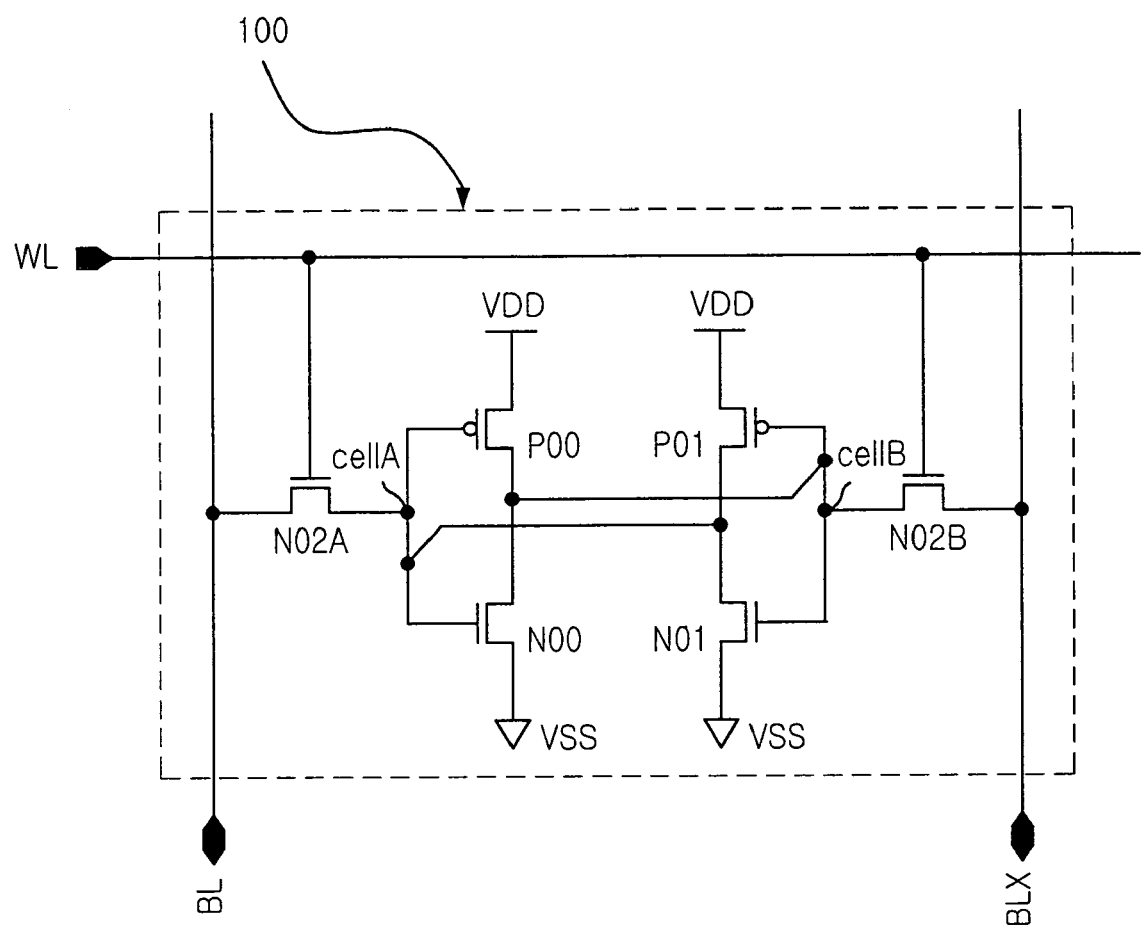
FIG. 1 is a circuit diagram of a single port SRAM memory with 6 transistors according to a prior art.
Figure 2:
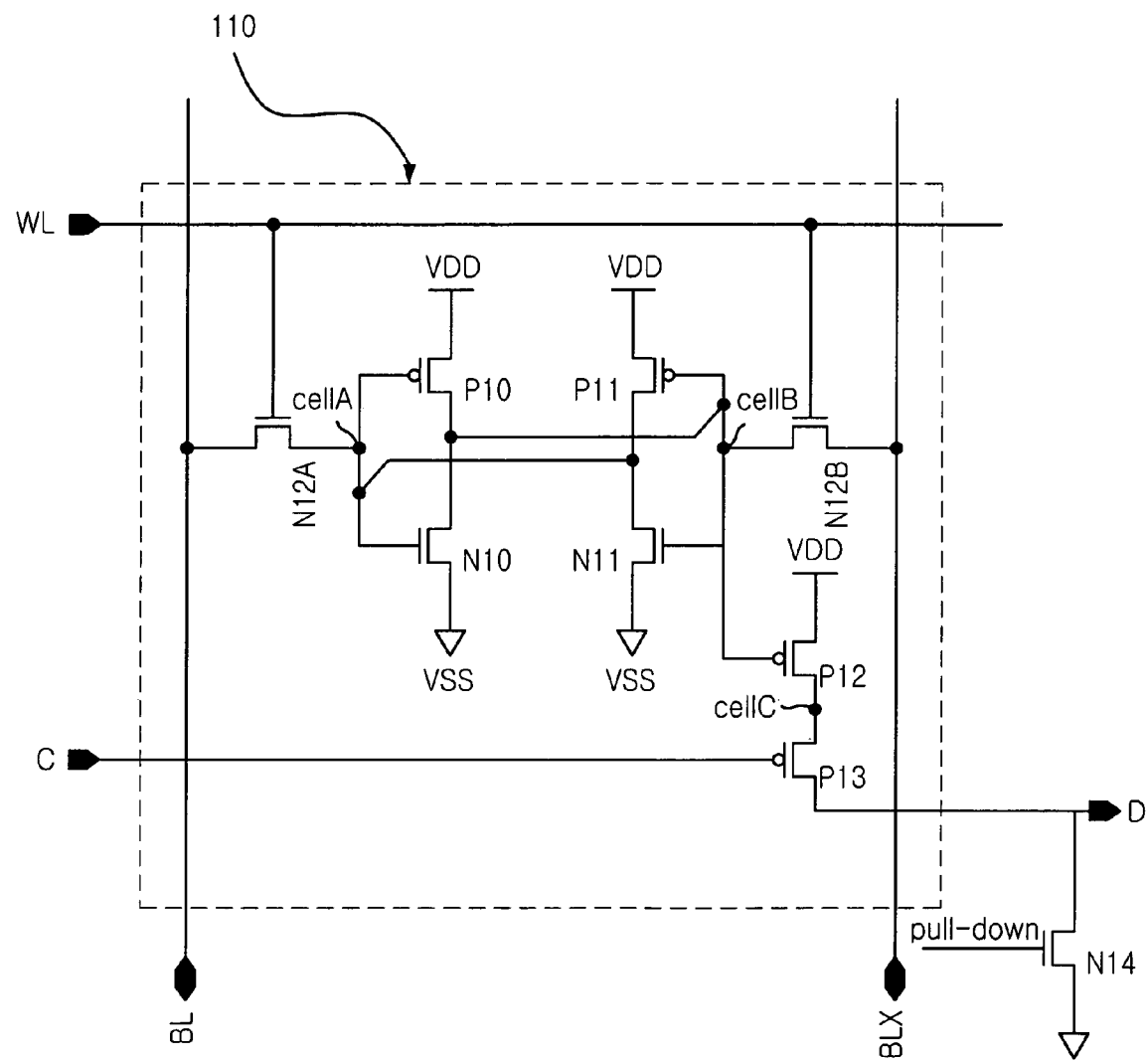
FIG. 2 is a circuit diagram of a dual port SRAM memory with 8 transistors according to another prior art.

Unlike the prior arts shown in FIGS. 1 and 2, the present invention is provided with only a single bit line BL, wherein there is omitted a negative bit line BLX carrying an inverted one of a signal on the bit line.

A selection of the memory cell is made through a word line WL and data is stored in the cell via the bit line BL. The data stored is outputted onto the data line DL by a control signal applied through a common line C.

More specifically, the 6 TR dual port SRAM cell 120 of the invention includes a writing section 122 which has one transistor and receives data signal from the single bit line BL under the control of a signal from the word line WL, a data storage section 124 which is constituted with three transistors and stores the data signal from the writing section 122, and a reading section 128 which is comprised of two transistors and reads the data signal stored in the data storage section 124 under the control of a signal via the common line C.

The writing section 122 includes a NMOS transistor N02A whose gate is coupled to the word line WL, one side terminal is connected to the bit line BL, and the other side terminal is coupled to the data storage section 124.

The NMOS transistor N20A is called an access transistor that inputs the signal on the bit line BL by its on or off depending on the signal on the word line WL. In switch ON state, the signal on the bit line BL is delivered to the inside of the memory cell; and, in switch OFF state, it is disconnected from the bit line. This access transistor is largely different from the NMOS transistors N02A and N12A shown in FIGS. 1 and 2 in that the cell consists of a single transistor although it performs a same function.

The data storage section 124 functions to store and maintain the inputted data. To implement this function, it comprises a PMOS transistor P21 whose gate is coupled to a cell storage node cell2A which is connected to the NMOS transistor N20A, and drain and source are coupled to a supply voltage VCC and a cell storage node cell2B, respectively, a NMOS transistor N20 whose gate is connected to the cell storage node cell2B, and drain and source are coupled to the cell storage node cell2A and the ground voltage VSS, respectively, and a NMOS transistor N21 whose gate is connected to the cell storage node cell2A, and drain and source are coupled to the cell storage node cell2B and the ground voltage VSS, respectively.

The reading section 128 includes a NMOS transistor N22 whose gate is coupled to the cell storage node cell2B, and drain and source are connected to the node cell2C and the ground voltage, respectively, and a NMOS transistor N23 whose gate is coupled to a common line C, and drain and source are connected to a data line D carrying read data and the node cell2C, respectively.

The PMOS transistor P24 for pull-up driving the data line D is added to the outside of the SRAM cell 120. Although there is not shown, the data line D is commonly coupled to each reading section of a plurality of arrayed memory cells; and, one of them is arranged per each block if memory cell array is blocked and distinguished.

Hereinafter, operation of the SRAM cell of the present invention shown in FIG. 3 will be described in detail.

(1) In WRITE mode:

User can store 1-bit data of H or L state in one SRAM cell 120.

When the user wants to write H signal in the SRAM cell 120 through an input pin of the bit line BL, H signal is first applied through the input pin of the bit line BL. If H signal is inputted onto the word line WL after the H signal is stably set-up in the bit line BL, then the NMOS transistor N20A becomes ON and the signal on the bit line BL is outputted onto the node cell2A. As a result, the node cell2A becomes H state.

When the node cell2A is H state, the PMOS transistor P21 becomes OFF and then the NMOS transistor N21 becomes ON state. From this, the node cell2B becomes L state and NMOS transistor N20 also becomes OFF state. As a result, the node cell2A becomes H and the node cell2B maintains the writing state of L.

In case of writing L signal in the SRAM memory cell 120, there is performed in the same manner. First, if L signal is applied onto the bit line BL and H signal is inputted onto the word line WL, then the transistor N02A becomes ON, allowing the signal on the bit line BL to be outputted. As a result, the node cell2A becomes logic L state.

When the node cell2A is L state, the PMOS transistor P21 is ON and the NMOS transistor N21 is OFF. Then, the node cell2B becomes H state, NMOS transistor N20 also becomes ON. Consequently, although the transistor N02A is OFF by the word line WL, but the nodes cell2A and cell2B are maintained as the writing state of logic H.

(2) In READ mode:

The data written in the nodes cell2A and cell2B of the SRAM memory cell 120 can be outputted onto the data line D through two NMOS transistors N22 and N23.

The data line D becomes logic H state by the PMOS transistor P24. The data line D provides L signal only if the two transistors N22 and N23 are all ON and outputs H signal if at least one is OFF, among the NMOS transistors N22 and N23.

The common line C serves to input an output signal for outputting the data written in the memory cell 120. When the signal on the common line C is H, a same signal level as the data on the node cell2A of the memory cell is outputted onto the data line D.

More specifically, if signal level of the bit line BL is H and thus the node cell2A is H state, then the node cell2B is L state. Thus, the NMOS transistor N22 is OFF and H signal is inputted onto the common line C, outputting H signal onto the data line D when the NMOS transistor N23 is ON.

Similarly, if signal level of the bit line BL is L and thus the node cell2A is L state, then the node cell2B is H state. Thus, the NMOS transistor N22 is ON and H signal is inputted onto the common line C, outputting L signal onto the data line D when the NMOS transistor 23 is ON.

Figure 4:
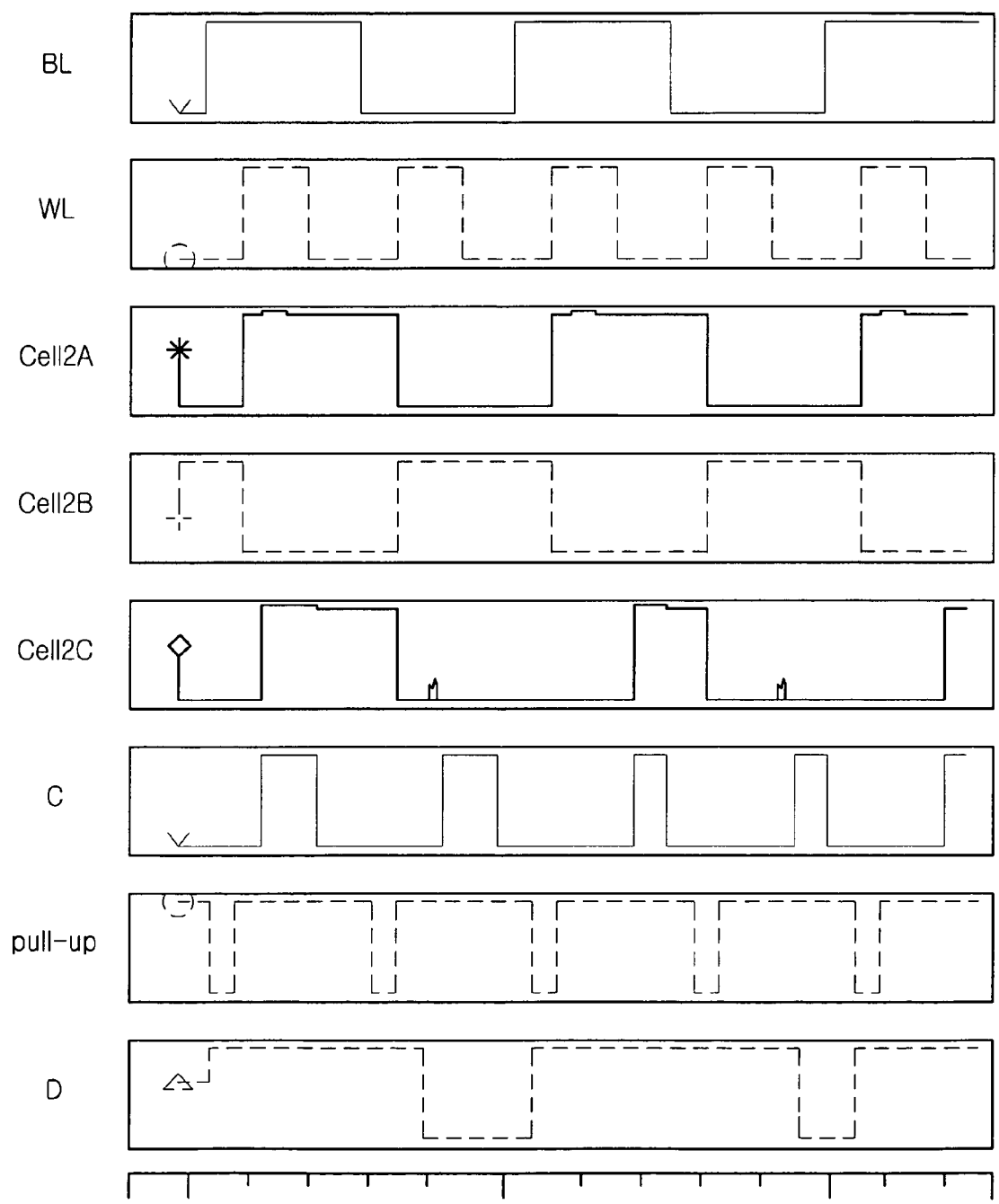
FIG. 4 is a timing diagram showing signal state for each element of the memory circuit shown in FIG. 3 in accordance with the invention.

FIG. 4 provides signal waveforms showing a simulation result of each part of the SRAM memory cell circuit in accordance with the present invention shown in FIG. 3.

In FIG. 4, signals, BL, WL, C, and pull-up, are control signals of the bit line BL, the word line WL and the common line C, and also control signal of the PMOS pull-up transistor P24, respectively.

Signals, Cell2A, Cell2B and Cell2C, are signal values at the node cell2A, the node cell2B and the node cell2C that are placed in the inside of the SRAM 120 shown in FIG. 3, respectively.

Further, a signal D is data signal that is outputted onto the data line D from the SRAM memory cell.

Now, process of applying data onto the nodes cell2A and cell2B of the SRAM memory cell through the bit line BL will be explained in detail.

As shown in FIG. 4, level of Cell2A signal is transited to a same level as the BL signal whenever the WL signal is transited to H state. This means that the signal of the bit line BL is outputted onto the node cell2A as it is, depending on the control signal on the word line WL.

On the other hand, the Cell2B signal always has a waveform that is of an inverse state to the Cell2A signal. This is to confirm that they have level inversion relationship between the Cell2B signal and the Cell2A signal.

In addition, even if the WL signal is transmitted from H to L, values of Cell2A and Cell2B signals are unchanged. This is to confirm that electrical potentials at the nodes cell2A and cell2B maintain without change although the NMOS transistor N20A that is access transistor is OFF by changing signal value on the word line WL from H to L in the memory cell circuit of FIG. 3. From the above, it can be seen that the memory cell of FIG. 3 can perform functions as memory well.

When reading the data written in the SRAM cell, it is possible to do so by making the control signal C inputted onto the common line C.

Meanwhile, before the data is read through the common signal C, it makes output data signal D on the data line D pulled-up in H state by using an input signal, pull-up, that is inputted to the PMOS transistor P24. In FIG. 3, the pull-up transistor P24 is operated when input thereto is L; and thus the output data signal D on the data line D has H state when the pull-up signal, pull-up, is L.

When the pull-up signal, pull-up, of L is outputted and then the output data signal D is pulled-up in H state, data written in the memory cell may be outputted onto the data line D if a control signal C that is read signal READ is inputted to the SRAM memory cell.

In FIG. 4, in the state that it is maintained that Cell2A is H and Cell2B is L, if instruction to read data is inputted by transiting the control signal C to H, H signal is outputted onto the data line D. Further, in the state that it is maintained that Cell2A is L and Cell2B is H, if instruction to read data is inputted by transiting the control signal C to H, L signal is outputted onto the data line D.

With the method as mentioned above, in response to BL, WL, C, that are signal values on the bit line BL, the word line WL, and the common line C, signal levels of Cell2A and Cell2B, that are data stored in the nodes cell2A and cell2B that are inside nodes of the SRAM memory cell, can be outputted onto the data line D as output data signal D.

By using the configurative features as mentioned above, the present invention can provide the dual port SRAM cell that utilizes 6 MOS transistors having advantages that it can improve degree of integration of the single port SRAM that is designed by 6 MOS transistors in the prior art (see FIG. 1) and the prior art dual port SRAM that is designed by 8 MOS transistors can perform writing and reading operations simultaneously (see FIG. 2).

The present application contains subject matter related to Korean patent application No. 2004-22194, filed in the Korean Patent Office on Mar. 31, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A dual port SRAM cell comprising:
    a writing section having a transistor for inputting a data input signal from a bit line in response to a control signal from a word line;
    a data storage section having only three transistors for storing the data input signal from the outside through the writing section; and
    a reading section having two transistors for reading the data input signal stored in the data storage section in response to control signal from a common line.

2. The dual port SRAM cell as recited in claim 1, wherein a gate of a first transistor coupled to the word line, one port of the first transistor is connected to a single bit line and another port of the first transistor is coupled to a transistor that is coupled to the data storage section.

3. The dual port SRAM cell as recited in claim 2, wherein the data storage section includes:
    a second transistor whose gate is coupled to a first node on said another port of the first transistor, and drain and source are connected to a first supply voltage and a second node, respectively;
    a third transistor whose gate is connected to the second node, and drain and source are coupled to the first node and a second supply voltage, respectively; and
    a fourth transistor whose gate is connected to the first node, and drain and source are coupled to the second node and the second supply voltage, respectively.

4. The dual port SRAM cell as recited in claim 3, wherein the reading section includes:
    a fifth transistor whose gate is coupled to the second node, and drain and source are connected to a third node and the second supply voltage, respectively; and
    a sixth transistor whose gate is connected to a common line, and drain and source are coupled to a data line carrying data to be read, and the third node, respectively.

5. The dual port SRAM cell as recited in claim 4, wherein the first, third, fourth, fifth and sixth transistors are NMOS transistors, and the second transistor is PMOS transistor.

6. The dual port SRAM cell as recited in claim 4, wherein the data line is pulled-up to a high logic voltage level before the signal is outputted.

7. A dual port SRAM cell, comprising:
    a writing section having a first transistor for inputting a data input signal from a bit line in response to a control signal from a word line;
    a data storage section having only a second, a third and a fourth transistors, wherein the second transistor is coupled to the output port of the first transistor, the third transistor is operated inversely to the second transistor, and the fourth transistor is operated inversely to the third transistor, the output port of the first transistor, the input port of the second transistor, the gate of the third transistor and the gate of the fourth transistor being commonly coupled to a first node and the input port of the third transistor and the output port of the fourth being commonly connected to a second node that is operated to have an inverse signal level to a signal level at the first node; and
    a reading section having a fifth and a sixth transistors, wherein the fifth transistor whose gate is coupled to the second node is pull-down operated and the sixth transistor whose gate is operated by a common line is connected to the fifth transistor to form a third node, to output an inverse signal to the signal at the second node in response to the signal from the common line.

8. The dual port SRAM cell as recited in claim 7, wherein the first, third, forth, fifth and sixth transistors are NMOS transistors, and the second transistor is PMOS transistor.

9. The dual port SRAM cell as recited in claim 7, wherein the output port of the sixth transistor is pulled-up to a high logic voltage level by a pull-up transistor before a signal is outputted.

10. The dual port SRAM cell as recited in claim 7, wherein the output port of the sixth transistor is pulled-up in H level by a pull-up transistor before a signal is outputted.

11. A dual port SRAM cell, comprising:
    a first node at which data from a bit line is maintained, wherein the data is inputted from the bit line in response to a control signal from a word line, stored and outputted onto a data line in response to a signal from a common line;
    a second node at which signal level is maintained in an inverse state to the input data at the first node; and
    a third node at which a same signal level as maintained at the first node is outputted in response to the signal on the common line.

12. The dual port SRAM cell as recited in claim 11, wherein the first node is commonly coupled to the output port of the first transistor, a gate of a second transistor, a gate of the third transistor, and a gate of a fourth transistor, for inputting the signal from the bit line in response to the input signal via the word line, and
    the second node is commonly connected to the gate of the second transistor, the one port of the third transistor, the output port of the fourth transistor, and the gate of the fifth transistor.

13. The dual port SRAM cell as recited in claim 12, wherein the first, third, forth and fifth transistors are NMOS transistors, and the second transistor is PMOS transistor.

14. The dual port SRAM cell as recited in claim 13, wherein the third node is commonly connected to the fifth transistor and the sixth transistor whose gate is operated by the signal on the common line.

15. The dual port SRAM cell as recited in claim 14, wherein the sixth transistor is NMOS transistor and its output port is pulled-up to a high logic voltage level by a pull-up transistor before a signal is outputted.

16. The dual port SRAM cell as recited in claim 11, wherein the third node is commonly connected to the fifth transistor and the sixth transistor whose gate is operated by the signal on the common line.

17. The dual port SRAM cell as recited in claim 16, wherein the sixth transistor is NMOS transistor and its output port is pulled-up to a high logic voltage level by a pull-up transistor before a signal is outputted.

18. The dual port SRAM cell as recited in claim 12, wherein the third node is commonly connected to the fifth transistor and the sixth transistor whose gate is operated by the signal on the common line.

19. The dual port SRAM cell as recited in claim 18, wherein the sixth transistor is NMOS transistor and its output port is pulled-up to a high logic voltage level by a pull-up transistor before a signal is outputted.

* * * * *